United States Patent
Carney et al.

(10) Patent No.: US 7,895,539 B2
(45) Date of Patent: Feb. 22, 2011

(54) SYSTEM FOR IMPROVING A LOGIC CIRCUIT AND ASSOCIATED METHODS

(75) Inventors: Christopher Carney, Red Hook, NY (US); Jose Luis Pontes Correia Neves, Poughkeepsie, NY (US); Biagio Pluchino, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 469 days.

(21) Appl. No.: 11/873,919

(22) Filed: Oct. 17, 2007

(65) Prior Publication Data

US 2009/0106709 A1    Apr. 23, 2009

(51) Int. Cl.
G06F 17/50    (2006.01)
(52) U.S. Cl. .................... 716/2; 716/6; 716/7
(58) Field of Classification Search ............. 716/2, 716/4–7, 11
See application file for complete search history.

(56) References Cited

U.S. PATENT DOCUMENTS

| | | | |
|---|---|---|---|
| 5,218,551 A * | 6/1993 | Agrawal et al. | 716/10 |
| 5,475,607 A * | 12/1995 | Apte et al. | 716/10 |
| 5,521,837 A * | 5/1996 | Frankle et al. | 716/10 |
| 5,648,913 A * | 7/1997 | Bennett et al. | 716/6 |
| 5,815,406 A * | 9/1998 | Golla et al. | 716/7 |
| 6,347,393 B1 | 2/2002 | Alpert et al. | 716/2 |
| 6,507,938 B1 | 1/2003 | Roy-Neogi et al. | 716/10 |
| 6,904,585 B2 | 6/2005 | Brittain et al. | 716/13 |
| 7,010,767 B2 | 3/2006 | Elassaad et al. | |
| 7,013,438 B1 | 3/2006 | Saldanha et al. | 716/2 |
| 7,206,967 B1 * | 4/2007 | Marti et al. | 714/25 |
| 7,480,886 B2 | 1/2009 | Carney et al. | |
| 2006/0112364 A1 | 5/2006 | Alpert et al. | |

OTHER PUBLICATIONS

P. Bai et al, "A 65nm Logic Technology Featuring 35nm Gate Lengths, Enhanced Channel Strain, 8 Cu Interconnect Layers, Low-k ILD and 0.57 um2 SRAM Cell", 4 pages, IEEE Jan. 4, 2004.
U.S. Appl. No. 11/334,256 Non-Final Office Action mailed Jan. 16, 2008.
U.S. Appl. No. 11/334,256 Office Communication mailed Oct. 10, 2008.
U.S. Appl. No. 11/334,256 Notice of Allowance mailed Sep. 12, 2008.

* cited by examiner

*Primary Examiner*—Sun J Lin
(74) *Attorney, Agent, or Firm*—William A. Kinnaman, Jr.

(57) ABSTRACT

A system for improving a logic circuit may include a processor, and a logic circuit analyzer in communication with the processor to model a plurality of nets. The system may also include an interface in communication with the logic circuit analyzer to select a target slack-value for each one of the plurality of nets. The logic circuit analyzer may determine a slack-value for each net. In addition, the logic circuit analyzer may selectively reduce resistive-capacitive delay for each net respectively if the determined slack-value is less than the target slack-value for each respective net.

17 Claims, 8 Drawing Sheets

SYSTEM FOR IMPROVING A LOGIC CIRCUIT AND ASSOCIATED METHODS

RELATED APPLICATION

This application contains subject matter related to a co-pending U.S. patent application Ser. No. 11/334,256 filed Jan. 18, 2006 and entitled "VLSI Timing Optimization with Interleaved Buffer Insertion and Wire Sizing Stages", the entire subject matter of which is incorporated herein by reference in its entirety. The aforementioned application is assigned to the same assignee as this application, International Business Machines Corporation of Armonk, N.Y.

FIELD OF THE INVENTION

The invention relates generally to the field of custom processor design, and in particular to the area of resistive-capacitive delay.

BACKGROUND OF THE INVENTION

Very large scale integrated (VLSI) circuit cards are usually the core components in today's highly complex electronic circuitry and/or logic circuitry found in mainframe servers. These circuit cards typically are packaged as multiple chips fabricated on a single card assembly or module, and are inherently referred to as multiple chip modules (MCM). Each chip on a MCM usually represents a distinct design component, and may have hierarchical components inside them as well.

A variety of design methods are employed in developing each chip, and a chip may be developed concurrently with other chips to speed up the MCM design process. In the end, the finished chips are usually assembled together on the MCM in a pre-determined layout using physical packaging information and the physical orientation of the module.

In a semiconductor chip design, there exist many thousands of wires that connect the various electrical sub-components. These sub-components are the manifestations of a self-imposed hierarchy which is used to partition the design into logical and physical contexts. This aids in the development of the chip because the sub-components can be worked on in parallel to one another, speeding up the design cycle.

The sub-components can take the form of several different entities such as random logic macros (RLM), custom circuit components, memory arrays, bit-stacks, units, super macros, and the like. Because of this hierarchy, a floor plan is usually necessary to arrange the sub-components. Many factors go into developing a floor plan, one of which is its overall effect on chip timing. Careful consideration is also given to congestion to ensure that the chip routing tool is able to successfully route all nets in the chip net list.

When dealing with very complicated and logically densely populated chips, it is often the case that many wires will have less than optimum lengths when traveling from one sub-component to another. This adversely affects the timing by adding resistive and capacitive delay to the wires.

In general the longer the wire, the larger these effects are. These properties, also known as parasitics, also get worse with increasing frequency. One of the goals of chip design is to minimize this resistive-capacitive (RC) delay through the use of chip buffering. By inserting buffers into long wires, essentially breaking them up into shorter wires, the risk of timing degradation due to RC delays is mitigated.

SUMMARY OF THE INVENTION

In view of the foregoing background, it is therefore an object of the invention to reduce the resistive-capacitive (RC) delay through a logic circuit.

This and other objects, features, and advantages in accordance with the invention are provided by a system to improve a logic circuit that may include a processor microprocessor, controller, or the like. The system may also include a logic circuit analyzer in communication with the processor to model a plurality of nets. The system may further include an interface in communication with the logic circuit analyzer to select a target slack-value for each one of the plurality of nets.

The logic circuit analyzer may determine a slack-value for each net. In addition, the logic circuit analyzer may selectively reduce resistive-capacitive delay for each net respectively if the determined slack-value is less than the target slack-value for each respective net.

The logic circuit analyzer may prioritize when and which resistive-capacitive delays are reduced for each net based upon a respective net's timing importance. The logic circuit analyzer may replace existing layer assignments and wire code assignments for each net with updated layer assignments and wire code assignments in order for each net to approach its respective target slack-value. The logic circuit analyzer may also change buffers within important timing paths for each net to low threshold voltage buffers if the determined slack-value is less than the target slack-value for a respective net.

Another aspect of the invention is a method to improve a logic block. The method may include selecting a target slack-value for each one of a plurality of nets, and determining a slack-value for each net. The method may also include reducing resistive-capacitive delay for each net respectively if the determined slack-value is less than the target slack-value for each respective net.

The method may further include prioritizing the reducing of any resistive-capacitive delay for each net based upon a respective net's timing importance. The method may additionally include replacing existing layer assignments and wire code assignments for each net with updated layer assignments and wire code assignments in order for each net to approach its respective target slack-value.

The method may also include changing buffers within important timing paths for each net to low threshold voltage buffers if the determined slack-value is less than the target slack-value for a respective net. The method may further include updating the layer assignments and wire code assignments for each net are based upon at least one of downgrading and upgrading of the existing layer assignments and wire code assignments to help a respective net approach its target slack-value. The updated layer assignments and wire code assignments for each net may aid in correcting slew violations for each respective net.

The method may also include re-buffering each net based upon respective updated layer assignments and wire code assignments. Additionally, each re-buffered net may aid in correcting slew violations for each respective net.

DETAILED DESCRIPTION OF THE PREFERRED EMBODIMENTS

The invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation and multiple prime notation is used to indicate similar elements in alternative embodiments.

As will be appreciated by one skilled in the art, the invention may be embodied as a method, system, or computer program product. Furthermore, the invention may take the form of a computer program product on a computer-usable storage medium having computer-usable program code embodied in the medium.

Any suitable computer usable or computer readable medium may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, or a magnetic storage device.

Computer program code for carrying out operations of the invention may be written in an object oriented programming language such as Java, Smalltalk, C++ or the like. However, the computer program code for carrying out operations of the invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The invention is described below with reference to flowchart illustrations and/or block diagrams of methods, apparatus (systems) and computer program products according to exemplary embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

Figure 7:
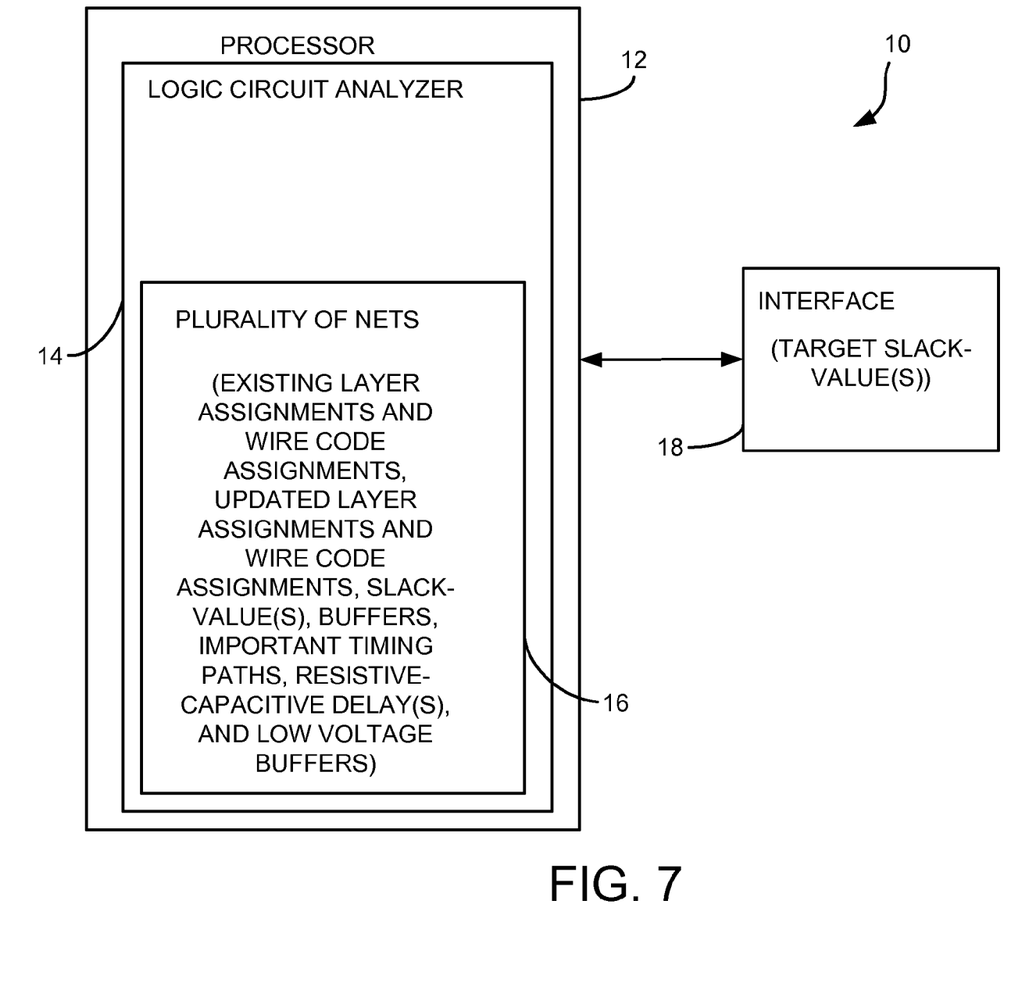
FIG. 7 is a block diagram illustrating a system to improve a logic block in accordance with the invention.

Referring initially to FIG. 7, a system 10 to improve a logic block is initially described. A logic block is hardware and/or software for executing programmable instruction, for example. The system 10 can be implemented in software, firmware, hardware or any combination thereof. The system 10 includes a processor 12, such as a microprocessor, controller, or other logic circuitry. The processor 12 is in communication with a logic circuit analyzer 14. In one embodiment, the logic circuit analyzer 14 includes hardware and/or software tools to model a plurality of nets 16 so that the functionality of the logic circuit can be improved. For example, the logic circuit analyzer 14 may use a buffer insertion program run from inside a physical design (PD) environment such as International Business Machine Corporation's (IBM) ChipBench™ or the like. This environment allows designers to load a design in memory and perform among other tasks timing analysis with a Static Timing Analyzer such as EinsTimer™ or the like.

In ChipBench™ a designer can also perform complex timing driven optimization or improvement functions, such as buffer insertion, repower, change of net properties (wire size and wire layers), and so forth. Due to the incremental features of EinsTimer™, each optimization or improvement change is reflected in the timing analysis immediately, allowing a designer to see the impact of optimization and correctly select which optimization operation to perform next.

The optimization or improvement functions can be executed individually and iteratively or they can be combined in scripts to implement more complex optimization flows to cover large portions of the design that require optimization. This is possible because each function can be invoked through an interpreted language such as the Tool Command Language (Tcl).

In one embodiment of the invention, the optimization flow is implemented with one core script and several sub scripts used to carry out the various timing related functions. At the conclusion of the buffer insertion and timing optimization or improvement steps, the new design is written in VIME format as common text to a logical directory in the design space in a UNIX operating environment. The VIME files can then be read into Cadence Design Systems' Virtuoso® PD environment or the like for processing by the chip integration team, for instance. As an alternative, the program can optionally generate a Cadence Design Systems' SKILL eco file, which can also be read into Virtuoso®, or any other scripting and/or description language.

In one embodiment, the system 10 further includes an interface 18 in communication with the logic circuit analyzer 14 to select a target slack-value for each one of the plurality of nets 16. In other words, a user may enter target slack-value into the logic circuit analyzer 14 via the interface 18.

The logic circuit analyzer 14 determines a slack-value for each net, for instance. In addition, the logic circuit analyzer 14 selectively reduces resistive-capacitive delay for each net respectively if the determined slack-value is less than the target slack-value for each respective net. Stated another way, the nets are selected for improvement or optimization if slack at the source is less then a user specified slack-value, and not based on wire length. This approach identifies the long nets as well as the short ones that need to be worked on.

In one embodiment, the logic circuit analyzer 14 prioritizes when and which resistive-capacitive delays are reduced for each net based upon a respective net's timing importance. For instance, using the incremental capabilities of EinsTimer™, the selection and optimization or improvement by slack-values ensures that the effects of optimizing each net are propagated throughout the design.

In one embodiment, the logic circuit analyzer 14 replaces existing layer assignments and wire code assignments for each net with updated layer assignments and wire code assignments in order for each net to approach its respective target slack-value. In another embodiment, the logic circuit analyzer 14 does not reset all wires to the highest layer and wire code possible and degrade from there (top-down approach). Rather, it begins with the existing layer and wire code assignments (established at the start of the run), and iteratively upgrades and re-buffers to meet the target slack-value(s), in a bottoms-up approach, for example.

In one embodiment, the logic circuit analyzer 14 removes a buffer solution that does not meet the target slack-values before new layers and/or wire codes are re-assigned and the net re-buffered. In contrast, older methodology always built upon the previous solution for a net and never deleted any buffers. This limited the optimization solution since more buffers were used in a net than necessary and the added delay of extra buffers limited the amount of optimization or improvement.

In one embodiment, the logic circuit analyzer 14 changes buffers within important timing paths for each net to low threshold voltage buffers if the determined slack-value is less than the target slack-value for a respective net.

For example, initially the nets are buffered with high Vt devices since these consume less power. If there are nets with negative slack after re-buffering with wire code and layer assignments, the buffers in such important nets are changed to low Vt devices as these buffers are faster than the high Vt ones. In addition, to reduce the use of low Vt devices, each change may be performed dynamically using incremental EinsTimer™ steps which re-computes the slack in the design after each change.

Figure 1:
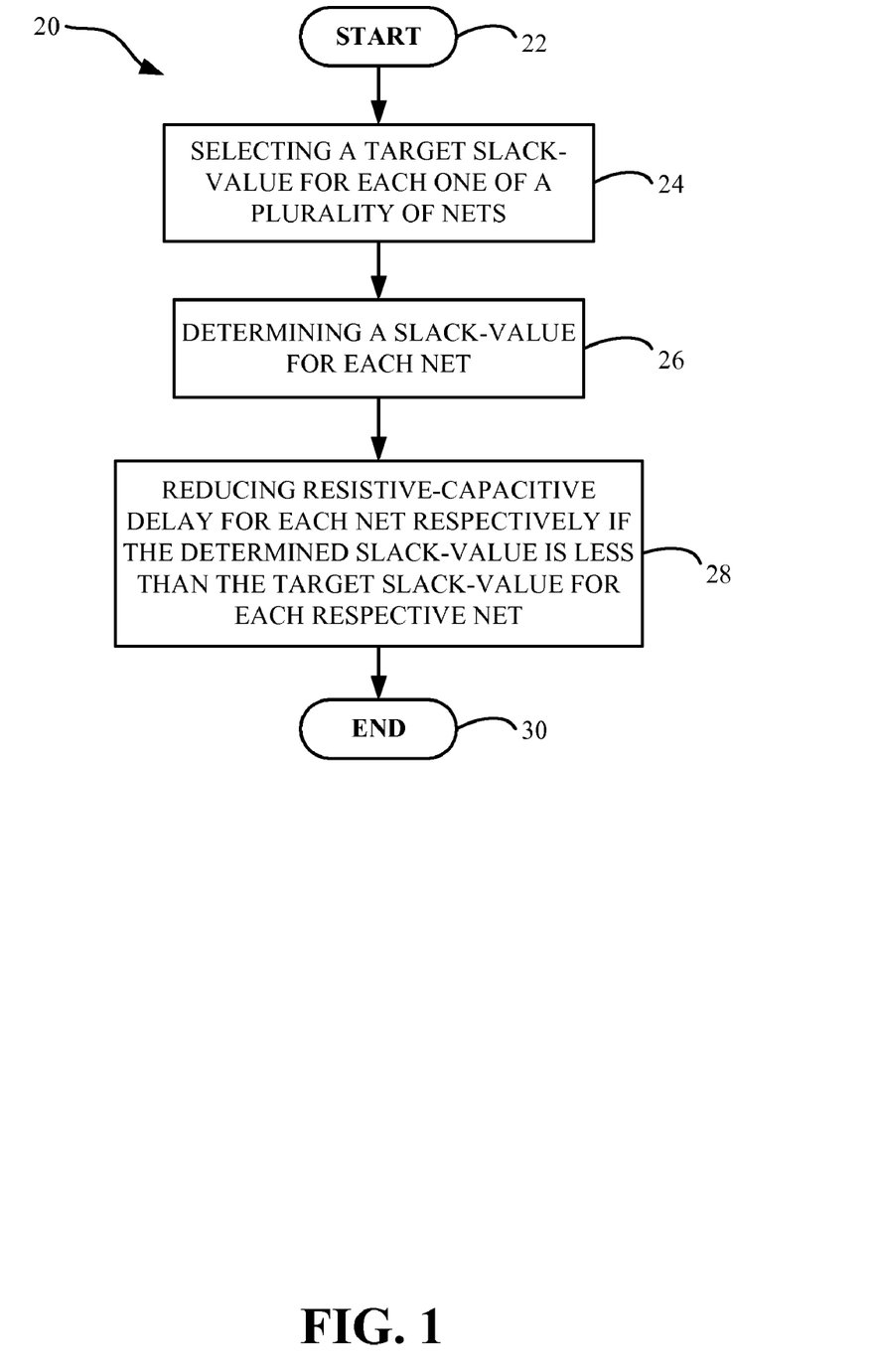
FIG. 1 is a flowchart illustrating a method to improve a logic block in accordance with the invention.

Another aspect of the invention is directed to a method to improve a logic circuit, which is now described with reference to flowchart 20 of FIG. 1. The method begins at Block 22 and may include selecting a target slack-value for each one of a plurality of nets at Block 24, and determining a slack-value for each net at Block 26. The method may further include reducing resistive-capacitive delays for each net respectively if the determined slack-value is less than the target slack-value for each respective net at Block 28. The method ends at Block 30.

Figure 2:
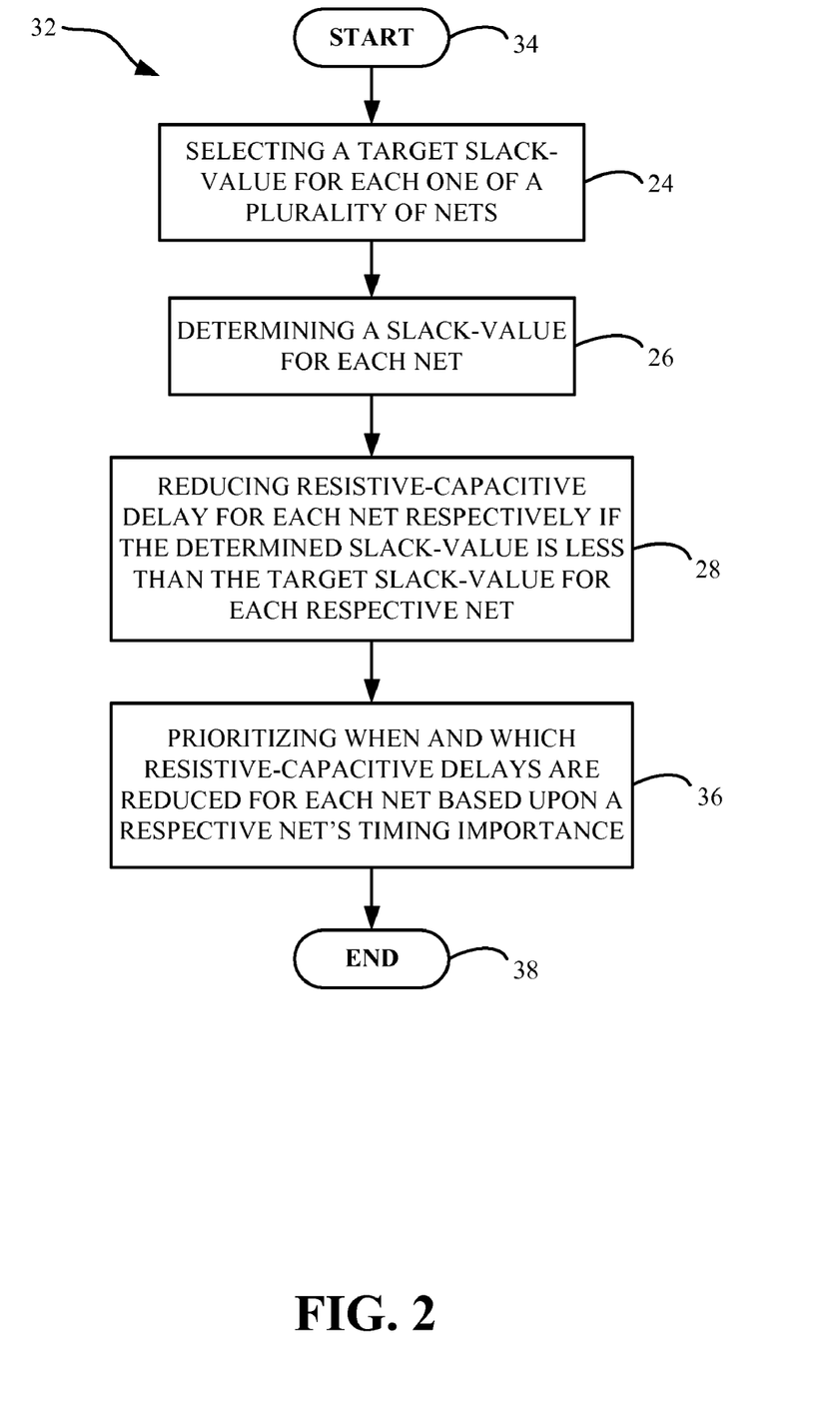
FIG. 2 is a flowchart illustrating an alternative method to improve a logic block using the method of FIG. 1.

In another method embodiment, which is now described with reference to flowchart 32 of FIG. 2, the method begins at Block 34. The method may include the steps of FIG. 1 at Blocks 24, 26, and 28. The method may also include prioritizing when and which resistive-capacitive delays are reduced for each net based upon a respective net's timing importance at Block 36. The method ends at Block 38.

Figure 3:
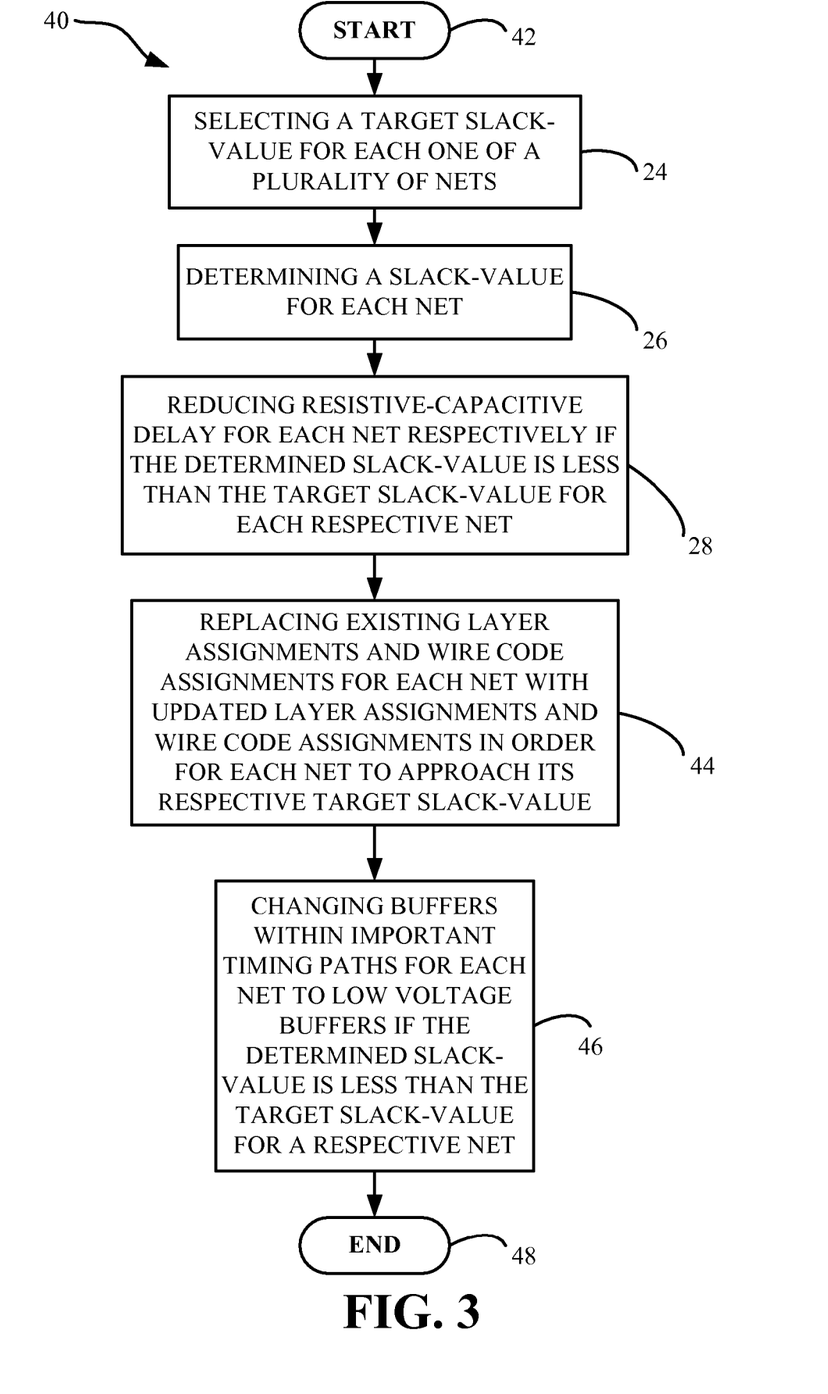
FIG. 3 is a flowchart illustrating another alternative method to improve a logic block using the method of FIG. 1.

In another method embodiment, which is now described with reference to flowchart 40 of FIG. 3, the method begins at Block 42. The method may include the steps of FIG. 1 at Blocks 24, 26, and 28. The method may also include replacing existing layer assignments and wire code assignments for each net with updated layer assignments and wire code assignments in order for each net to approach its respective target slack-value at Block 44. The method may further include changing buffers within important timing paths for each net to low threshold voltage buffers if the determined slack-value is less than the target slack-value for a respective net at Block 46. The method ends at Block 48.

Figure 4:
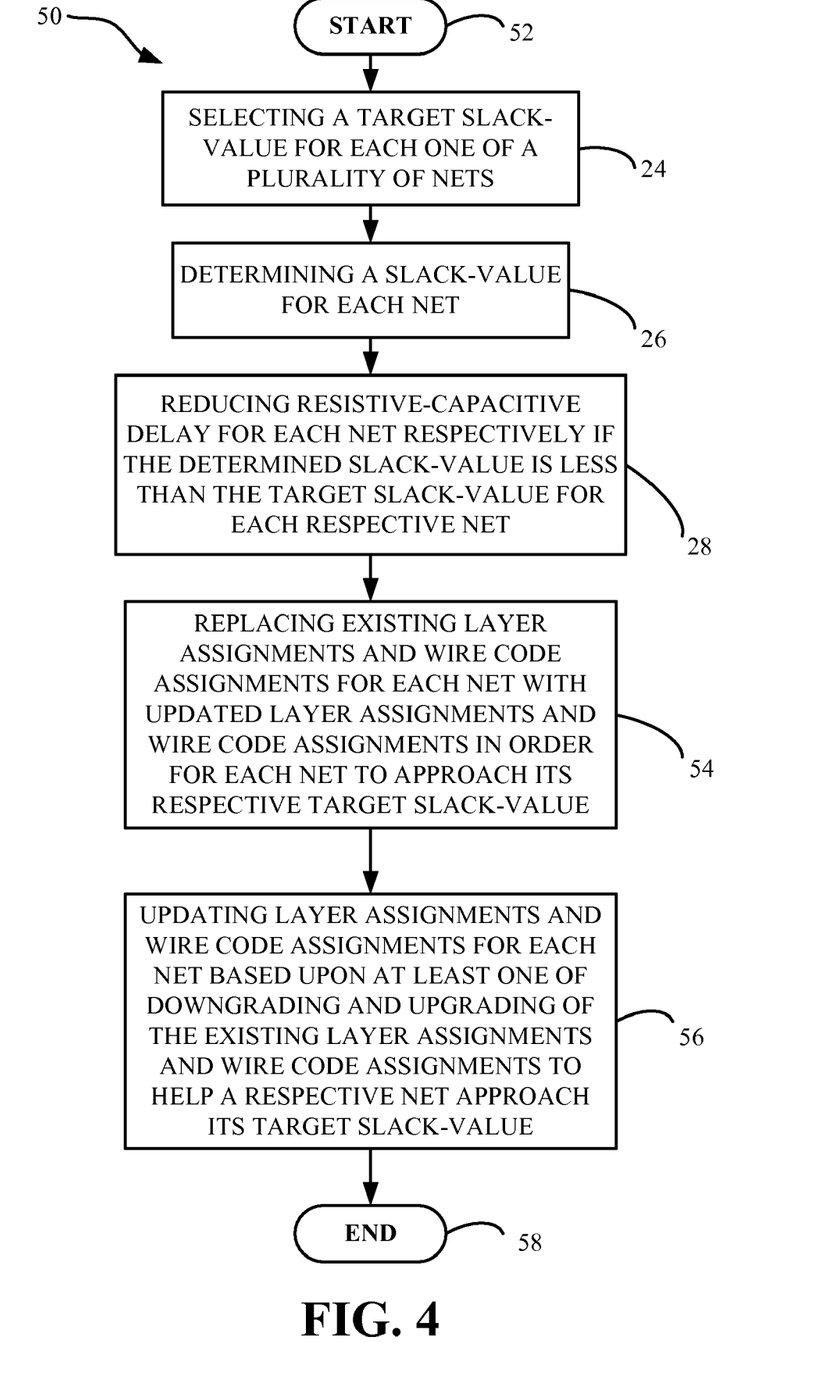
FIG. 4 is a flowchart illustrating another alternative method to improve a logic block using the method of FIG. 1.

In another method embodiment, which is now described with reference to flowchart 50 of FIG. 4, the method begins at Block 52. The method may include the steps of FIG. 1 at Blocks 24, 26, and 28. The method may also include replacing existing layer assignments and wire code assignments for each net with updated layer assignments and wire code assignments in order for each net to approach its respective target slack-value at Block 44. The method may further include updating layer assignments and wire code assignments for each net based upon at least one of downgrading and upgrading of the existing layer assignments and wire code assignments to help a respective net approach its target slack-value at Block 56. The method ends at Block 58.

Figure 5:
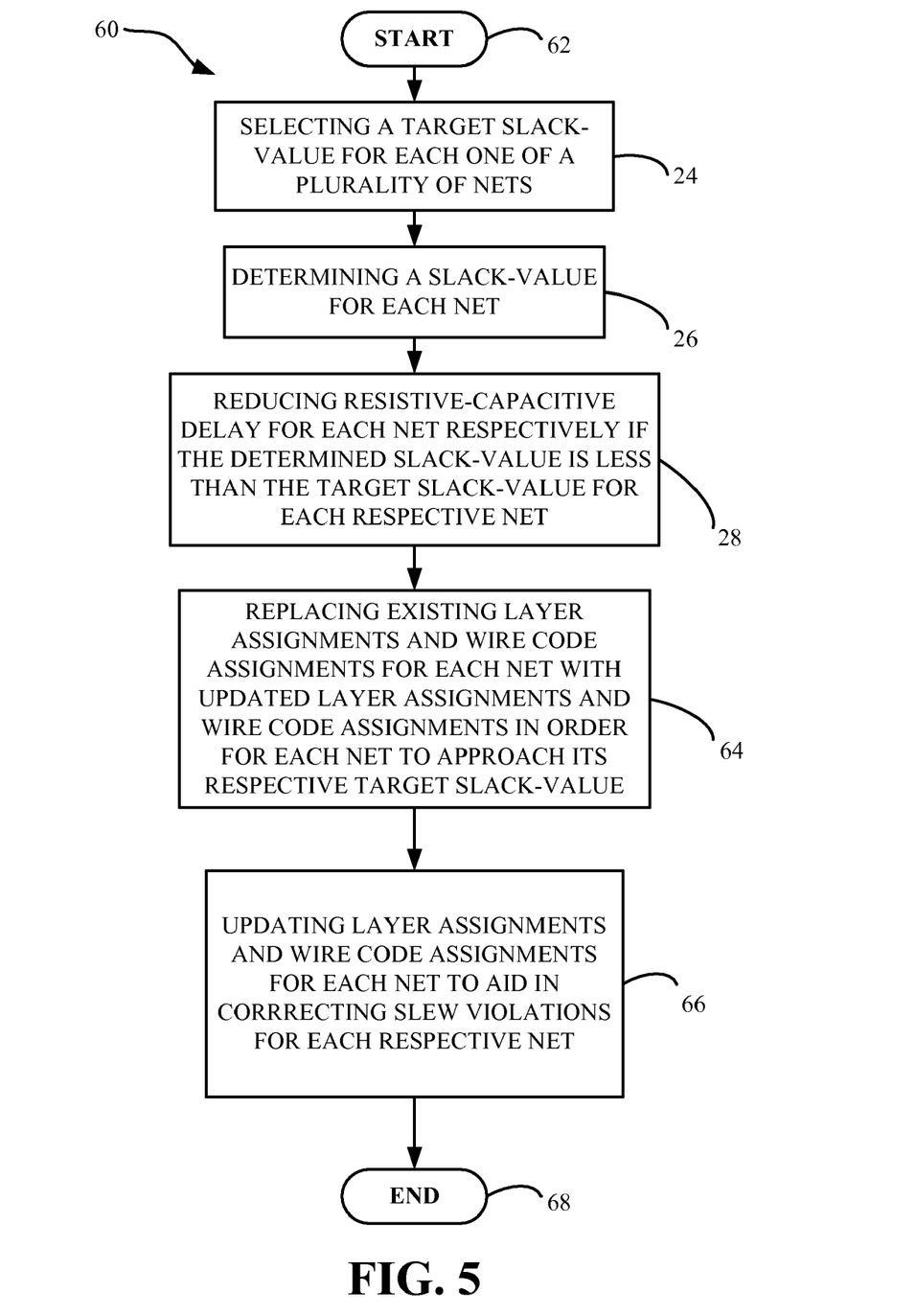
FIG. 5 is a flowchart illustrating another alternative method to improve a logic block using the method of FIG. 1.

In another method embodiment, which is now described with reference to flowchart 60 of FIG. 5, the method begins at Block 62. The method may include the steps of FIG. 1 at Blocks 24, 26, and 28. The method may also include replacing existing layer assignments and wire code assignments for each net with updated layer assignments and wire code assignments in order for each net to approach its respective target slack-value at Block 64. The method may further include updating layer assignments and wire code assignments for each net to aid in correcting slew violations for each respective net at Block 66. The method ends at Block 68.

Figure 6:
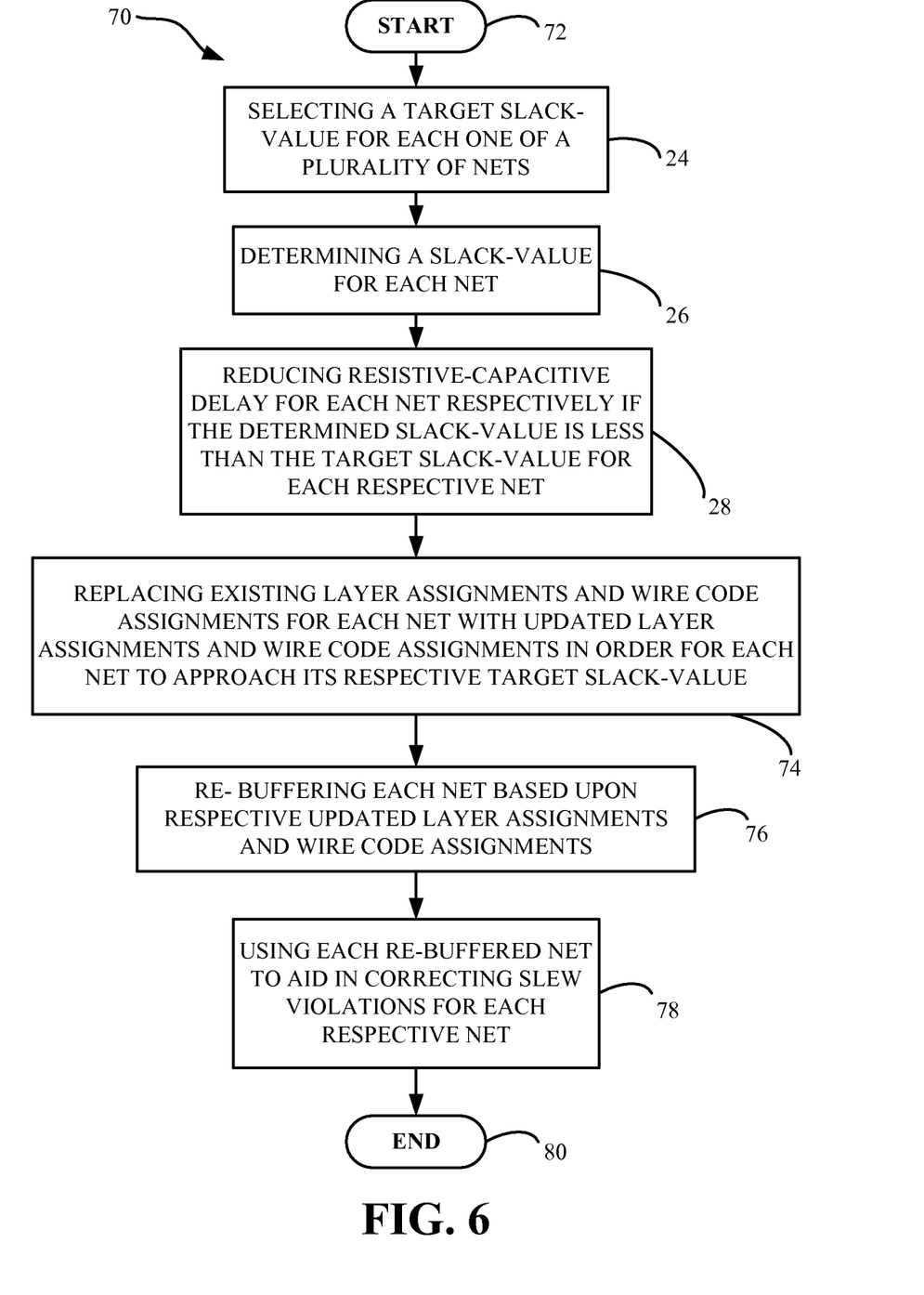
FIG. 6 is a flowchart illustrating another alternative method to improve a logic block using the method of FIG. 1.

In another method embodiment, which is now described with reference to flowchart 70 of FIG. 6, the method begins at Block 72. The method may include the steps of FIG. 1 at Blocks 24, 26, and 28. The method may also include replacing existing layer assignments and wire code assignments for each net with updated layer assignments and wire code assignments in order for each net to approach its respective target slack-value at Block 74. The method may further include re-buffering each net based upon respective updated layer assignments and wire code assignments at Block 76. The method may additionally include using each re-buffered net to aid in correcting slew violations for each respective net at Block 78. The method ends at Block 80.

Accordingly, the foregoing methodologies provide a series of timing optimization or improvement routines coupled with wire congestion mitigation techniques. As such, logic circuit analyzer's 14 purpose is to improve timing as much as possible with minimal use of buffer resources, and also improve wire congestion, for example. Due to the variety of runtime parameters it has the potential for numerous applications.

The timing driven buffer methodology takes in a design and performs buffer insertion, wire layer and wire code optimization or improvement to achieve the desired target slack-value(s). The logic circuit design that is read into the logic circuit analyzer 14 can be either previously buffered or completely unbuffered.

The methodology used predominantly on the level two cache (L2) was to take a design that had been previously buffered by a slew driven buffer insertion tool such as addBuf or the like, and identify a set of nets that did not meet a timing slack target. For each net, the slew driven buffer solution was removed. Then by using a succession of iterative buffering steps coupled with wire layer and wire code upgrades, the slack of the net was driven to zero.

Due to incremental EinsTimer™, each candidate solution is evaluated in the design and the slack improvement propagated to other nets in the design. This process is repeated for all the other nets initially identified with negative slack.

Figure 8:
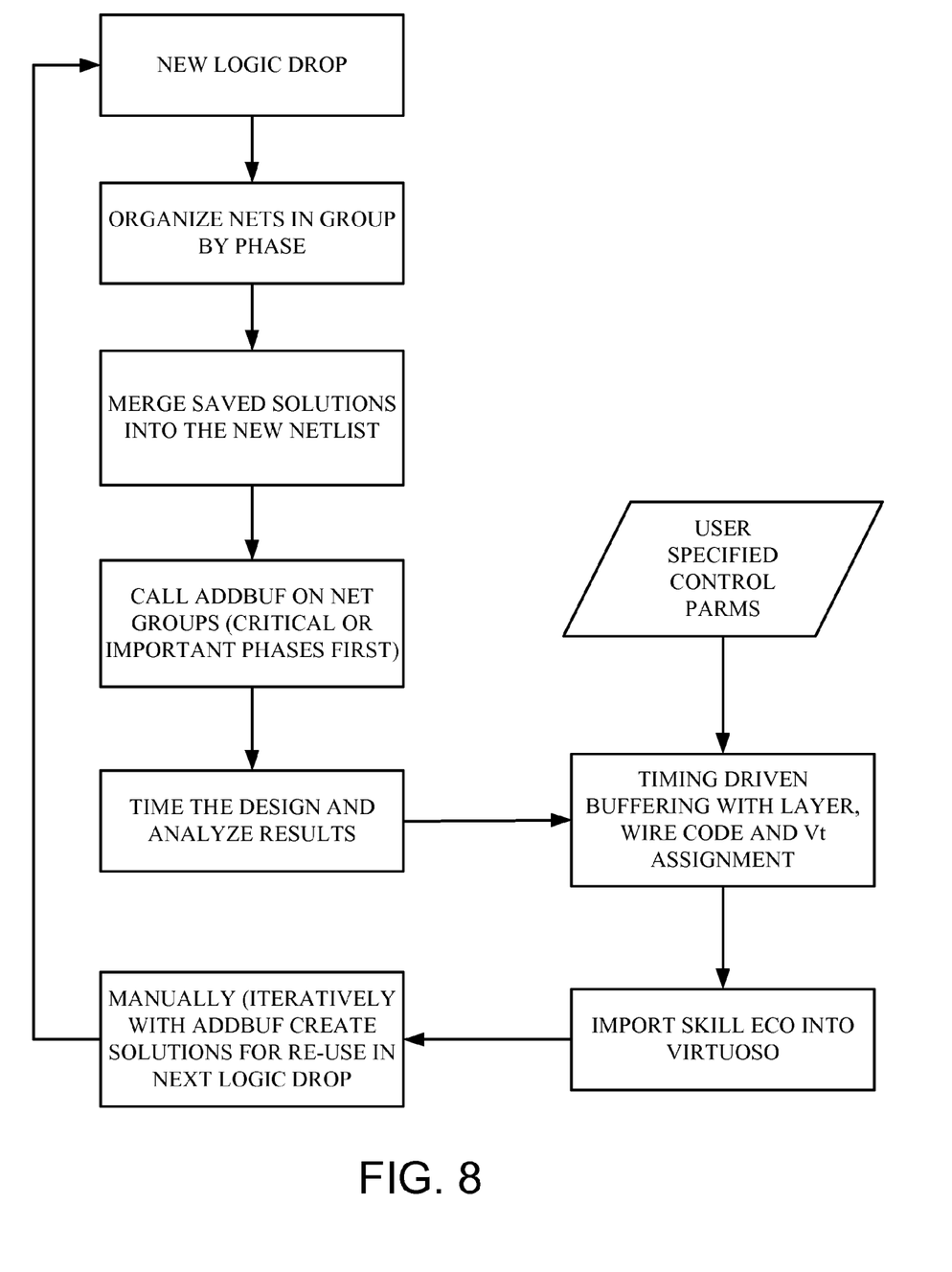
FIG. 8 is a flowchart illustrating an exemplary use of the method of FIG. 1 within an existing buffer insertion methodology.

The final buffered design was then read back into Cadence so that the improved solutions could be saved (either partially or completely) for the next logic drop. In FIG. 8, the new buffer insertion methodology is presented as it is used within the existing buffer insertion methodology. If the timing driven steps are not used there would be a straight arrow from the timing analysis block to the iterative step.

The timing driven buffer methodology consists of 5 timing optimization or improvement routines coupled with 1 wireability optimization or improvement routine. The timing optimization or improvement steps are:

1. Improve slack through buffer insertion
2. Improve slack through wire upgrades
3. Improve slack through buffer Vt conversion
4. Fix slew violations through buffer insertion
5. Fix slew violations through wire upgrades The wireability optimization or improvement is to degrade wire layers and/or wire codes in nets with positive slack in order to reduce congestion on the better metal layers (of which there are fewer resources available) such that the final net slack is still positive. The optimization or improvement steps (1, 2, 4, and 5) will remove existing buffer solutions on a net in order to keep buffer usage to a minimum and enable optimal or improved buffer solutions with the new resources.

The main program of the logic circuit analyzer 14 implements the optimization or improvement steps in a pre-determined order. These are followed by the wireability optimization or improvement step. The program execution flow is described below and was implemented using an interpreted language (Tcl script) supported by the ChipBench™ design environment.

This flow is usually divided into three parts. Part one optimizes or improves late mode slack. Part two fixes slew violations on negative and positive slack nets. Part three trades off slack for buffer and wiring resources to reduce wiring congestion.

Part 1—Slack Optimization or Improvement
1. Obtain a list of the critical or important nets based on the specified target slack-value(s)
2. Exclude any user selected nets
3. Initialize a slack table to track slack optimization or improvement progress through the buffer insertion and wire upgrade steps
4. Perform buffer insertion on the list of critical or important nets with timing awareness by:
  a. For each critical or important net
    i. Removing existing buffer tree (if applicable)
    ii. Re-buffering in order to achieve optimum or improved slack
5. Begin iterative buffer insertion and/or wire upgrade steps on remaining list of critical or important nets (optional)
  a. While slack<0 and iterations<limit (aggression parm)
    i. Select wire code and layer pair from table
    ii. Remove existing buffer tree (if applicable)
    iii. Upgrade wire code and/or wire layer
    iv. Run buffer insertion to improve slack
    v. Update slack table
    vi. Increment iterations (set by 'aggression' parm)
6. On remaining list of critical or important nets (if any) convert high Vt chip buffers to low Vt to improve slack Part 2—Slew Optimization or Improvement
7. Obtain nets with slew violations (clock phase driven)
8. For each net in the list
  a. Perform buffer insertion to fix slew violations while preserving the slack target
9. For each net in the remaining list
  a. Assign wire layer and/or wire code upgrade from selection table
  b. Remove any buffers added for slew fixes leaving buffers added for slack improvements
  c. Run buffer insertion to fix slew violations
  d. Repeat until violation fixed or no more options in selection table Part 3—Wireability Optimization or Improvement
10. Obtain nets with positive slack above user defined threshold
11. For each net in the list
  a. Remove existing buffer solution
  b. Degrade or downgrade wire code and/or wire layer from selection table
  c. Re-buffer the net
  d. Repeat while slack>0 and no slew violations and no more options in selection table
12. Compute and save final design optimization or improvement metrics
13. Write out design (eco file generation optional)

The optimization or improvement parts in the flow, the steps within each part and the order of execution are controlled by a set of user modifiable parameters. These parameters are stored in a readable file, for example.

The user has control of the flow through a parameters (parms) file that serves three purposes. One purpose is for the user to control which steps of the flow are executed, the order of execution and the frequency of execution. For example, if slew violations should be fixed while optimizing or improving for slack.

Another purpose is for the user to specify optimization or improvement parameters to select which nets to optimize and the optimization goals for buffer insertion such as slew limit, slack goal, etc. A third purpose is for the user to specify where the data is written into and special files containing for example excluded nets, and target slews for the various phases in the design.

The net buffer insertion step uses a buffer insertion tool designed for buffer insertion such as buffopt disclosed in U.S. Pat. Nos. 6,591,411; 6,915,496; 6,898,774; 6,560,752; and 6,347,393 and U.S. Published application No. 20050138578A1, and so forth, fully integrated with the PD design environment (ChipBench™) and the timing analysis (EinsTimer™). This tool inserts buffers on a net with one or more sinks to improve slack and/or slew following a net topology and being aware of any placement blockages in the design.

An important part of the methodology is the iterative buffer insertion and wire upgrade steps within the Slack Optimization flow above. The flow does a buffer removal/insertion pass on all the critical or important nets. This initial pass uses the layers and wire code assigned to each net.

As the logic circuit analyzer's 14 program proceeds through the iterations, the number of critical or important nets decreases as improved nets meet or exceed the target slack-value(s). The remaining failing nets, if any, are then processed by a step of buffer optimization or improvement mixed with layer and wire code assignment.

For each failing net, an existing buffer solution is removed and the layers and wire code are upgraded incrementally to the next set of available combinations. After that the net is re-buffered and the results evaluated. If the target slack-value (s) is not met, a new set of layer and wire code is chosen and the removal/insertion step is repeated. The substitution and re-buffer is exhaustive as it starts with the current assignment and chooses the next available combination until all the combinations are used.

The user, via interface 18, controls the runtime in two ways. First, the user defines which layer pairs and wire codes the optimization or improved flow can use. Second, the user also controls the number of attempts (combinations of layers and wire code) the flow tries before giving up on fixing a critical or important net.

Depending on the design and any congestion concerns, particularly at the upper layers of metal, the user can elect a conservative number of iterations resulting in a less congested wiring map at the upper layers at the expense of somewhat sub-optimal timing. Conversely, the user can elect a highly aggressive number of iterations resulting in possible local or globally wiring congested areas at the higher layers, but ensuring the most optimum or improved timing possible. The use of the aggression parameter gives the user flexibility to experiment and determine the best number for his or her design simply by modifying this number at runtime.

The Slack Optimization flow is followed by a Slew Optimization flow. In this step the critical or important nets are chosen if they fail a slew limit. This limit is clock phase dependent and the user has the ability to define the limit per phase as well as define how much deviation of the limit is allowed for nets that are very positive in slack.

This flow differs from the previous one in that no buffer solution is removed prior to re-buffering. If buffers are inserted they will be in addition to existing ones, except in the case of layer and wire code assignment. The second difference is that the buffer insertion algorithm targets slew instead of slack.

As such, the goal is to meet the existing slack while fixing the slew violation. If wire code and layers are re-assigned, any buffers added by the Slew Optimization flow are removed prior to the net being re-buffered. However, any buffers added by the Slack Optimization flow are kept.

The Wireability Optimization or improvement flow (wire degrade or downgrade) is designed to reduce usage of the upper metal layers (where there are less available wiring tracks) at the expense of degrading the slack on a net. It is used on positive slack nets and the outcome is a design where the overall wiring congestion is improved with a small penalty in the timing histogram. The flow is similar to the Slack Optimization flow.

The difference is that the set of nets the flow works on is chosen from very positive slack nets. The flow is similar in that an existing buffer solution is removed before the net is degraded to lower layers and/or a wire code associated with a thinner wire. The other difference is that a buffer solution is only accepted if the slack is still positive and above a user defined threshold which is less then the threshold to select the critical or important nets.

The flows through logic circuit analyzer 14 are implemented with an interpreted language, such as Tcl, and are very flexible in that they will work with any design given that the technology information and optimization or improvement goals are described in files. For the Wiring change steps, the user provides to the flow two files. One file contains the set of wire layers and wire codes allowed in the optimization or improvement and a PDL (Physical Description Language) file containing the RC values for every wire layer/wire code combination for the particular technology.

Often a PDL contains many more wire layer and wire code pairs than are actually used in a design. The purpose of the first file is to instruct the program which wire layers and wire codes are to be used when upgrading/degrading the critical/non-critical nets. Moreover, the integrator may specify certain layers/wire codes to use or not to use based on physical properties of the wires on those layers, so this format gives the program additional flexibility.

Each entry in the PDL file contains a wire layer/wire code pair, followed by a resistance value, a capacitance value, and an RC value. It is the RC value that is used to determine how far each wire can be degraded before falling below the slack target.

The flow through the logic circuit analyzer 14 provides several metrics to gauge the success of the entire design optimization or improvement, such as old and new figure of merit (FOM), or slack improvement histogram, number of nets improved/degraded, number of buffers added/removed after optimization or improvement, and number of wires added/gained per layer. At the conclusion of the user selected optimization parts, the design is written out to the design space.

The buffer, wire code and layer changes can be merged into the netlist in two ways. One is to write out the design at the end of the run in ChipBench™ and read it back into Cadence's Virtuoso® and merge the changes into the existing netlist.

The other is to write out a SKILL eco file which is imported into Cadence's Virtuoso® to be saved and used for the next logic drop. The timing driven buffer methodology can be either script-driven or can be launched from Cadence's EFP Buffer menu, allowing the process to be run by either a traditional timing coordinator or someone such as an integrator or circuit designer who works more with Cadence-style tools or the like.

Runtimes for the timing driven buffer insertion methodology are dependent on design data, but typically take from 3-5 hours to perform all the optimization or improvement routines on a complicated unit such as the L2. Runtimes can be further decreased if (as mentioned earlier) as many of the optimized or improved buffer solutions can be preserved as possible for the next drop of logic.

Doing so implies a smaller set of critical or important nets the next time the program is run, thus decreasing its runtime on subsequent executions. Through the use of the exclude lists, the integrator can generate a list of nets to not process (any nets that were optimized or improved to meet the target slack-value(s) and did not change logically with the new drop), and then generate a text file containing those nets.

The buffer insertion program can in turn read that file in as an exclude file, thereby leaving the optimized or improved solutions in tact for those nets and further decreasing runtimes. In this fashion the timing driven buffer methodology would be operating in an engineering change control, or EC mode with respect to the integration and logic tasks.

The timing driven buffer methodology provides a robust timing optimization or improvement suite along with a wire congestion alleviation algorithm. Through the use of various user-supplied parms the methodology is adaptable to a wide platform of applications and can be incorporated into the development process of most VLSI designs.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that other modifications and embodiments are intended to be included within the scope of the appended claims.

That which is claimed is:

1. A method comprising:
 selecting a target slack-value for each one of a plurality of nets in an electric circuit;
 determining a slack-value for each net by a computer processor;
 reducing resistive-capacitive delays for each net respectively if the determined slack-value is less than the target slack-value for each respective net; and
 prioritizing when and which resistive-capacitive delays are reduced for each net based upon a respective net's timing importance.

2. The method of claim 1 further comprising replacing existing layer assignments and wire code assignments for each net with updated layer assignments and wire code assignments in order for each net to approach its respective target slack-value.

3. The method of claim 2 further comprising hanging buffers within important timing paths for each net to low threshold voltage buffers if the determined slack-value is less than the target slack-value for a respective net.

4. The method of claim 2 wherein the updated layer assignments and wire code assignments for each net are based upon at least one of downgrading and upgrading of the existing layer assignments and wire code assignments to help a respective net approach its target slack-value.

5. The method of claim 2 wherein the updated layer assignments and wire code assignments for each net to aid in correcting slew violations for each respective net.

6. The method of claim 2 further comprising re-buffering each net based upon respective updated layer assignments and wire code assignments.

7. The method of claim 6 wherein each re-buffered net aids in correcting slew violations for each respective net.

8. A computer program product embodied in a non-transitory computer-readable medium comprising:
 computer readable program codes coupled to the non-transitory computer-readable medium for improving a logic circuit, the computer readable program codes configured to cause a computer to:
 select a target slack-value for each one of a plurality of nets;
 determine a slack-value for each net;
 reduce resistive-capacitive delays for each net respectively if the determined slack-value is less than the target slack-value for each respective net; and
 prioritize when and which resistive-capacitive delays are reduced for each net based upon a respective net's timing importance.

9. The computer program product of claim 8 further comprising program code configured to: replace existing layer assignments and wire code assignments for each net with updated layer assignments and wire code assignments in order for each net to approach its respective target slack-value.

10. The computer program product of claim 9 further comprising program code configured to: change buffers within important timing paths for each net to low threshold voltage buffers if the determined slack-value is less than the target slack-value for a respective net.

11. The computer program product of claim 9 further comprising program code configured to: at least one of downgrade and upgrade the existing layer assignments and wire code assignments to help a respective net approach its target slack-value.

12. The computer program product of claim 9 further comprising program code configured to: aid in correcting slew violations for each net via respective updated layer assignments and wire code assignments.

13. The computer program product of claim 9 further comprising program code configured to: re-buffer each net based upon respective updated layer assignments and wire code assignments.

14. The computer program product of claim 13 further comprising program code configured to: aid in correcting slew violations for each net via each respective re-buffered net.

15. A system to improve a logic circuit comprising:
 a processor;
 a logic circuit analyzer in communication with said processor to model a plurality of nets; and
 an interface in communication with said logic circuit analyzer to select a target slack-value for each one of the plurality of nets; and
 said logic circuit analyzer to determine a slack-value for each net, and to selectively reduce resistive-capacitive delays for each net respectively if the determined slack-value is less than the target slack-value for each respective net; and
 wherein said logic circuit analyzer prioritizes when and which resistive-capacitive delays are reduced for each net based upon a respective net's timing importance.

16. The system of claim 15 wherein said logic circuit analyzer replaces existing layer assignments and wire code assignments for each net with updated layer assignments and wire code assignments to help each net approach its respective target slack-value.

17. The system of claim 16 wherein said logic circuit analyzer changes buffers within important timing paths for each net to low threshold voltage buffers if the determined slack-value is less than the target slack-value for a respective net.

* * * * *